US006767689B2

(12) United States Patent
Pavelchek et al.

(10) Patent No.: US 6,767,689 B2
(45) Date of Patent: Jul. 27, 2004

(54) ANTIREFLECTIVE COATING COMPOSITIONS

(75) Inventors: Edward K. Pavelchek, Stow, MA (US); Peter Trefonas, III, Medway, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/142,734

(22) Filed: May 10, 2002

(65) Prior Publication Data

US 2003/0008237 A1 Jan. 9, 2003

Related U.S. Application Data

(60) Provisional application No. 60/290,446, filed on May 11, 2001.

(51) Int. Cl.[7] .................................................. G03C 1/76

(52) U.S. Cl. .................... 430/271.1; 430/325; 430/326; 430/921

(58) Field of Search ............................. 430/271.1, 325, 430/326, 921

(56) References Cited

U.S. PATENT DOCUMENTS

| | | | | |
|---|---|---|---|---|
| 4,661,429 A | * | 4/1987 | Molaire et al. | 430/70 |
| 5,851,730 A | | 12/1998 | Thackeray et al. | |
| 5,935,760 A | | 8/1999 | Shao et al. | |
| 5,939,236 A | | 8/1999 | Pavelchek et al. | |
| 6,033,830 A | | 3/2000 | Sinta et al. | |
| 6,156,479 A | | 12/2000 | Meador et al. | |
| 6,190,839 B1 | | 2/2001 | Pavelchek et al. | |
| 6,261,743 B1 | | 7/2001 | Pavelchek et al. | |
| 6,316,165 B1 | | 11/2001 | Pavelchek et al. | |
| 6,323,310 B1 | | 11/2001 | Puligadda et al. | |
| 6,410,209 B1 | | 6/2002 | Adams et al. | |
| 6,451,503 B1 | | 9/2002 | Thackeray et al. | |
| 6,461,717 B1 | * | 10/2002 | Rutter, Jr. et al. | 428/139 |
| 6,472,128 B2 | | 10/2002 | Thackeray et al. | |
| 6,503,689 B2 | | 1/2003 | Zampini et al. | |
| 6,528,235 B2 | | 3/2003 | Thackeray et al. | |
| 2002/0022196 A1 | | 2/2002 | Pavelchek et al. | |
| 2002/0031729 A1 | | 3/2002 | Trefonas, III et al. | |
| 2002/0094382 A1 | * | 7/2002 | Imai et al. | |
| 2002/0127490 A1 | * | 9/2002 | Brock et al. | |

FOREIGN PATENT DOCUMENTS

| | | |
|---|---|---|
| EP | 0 425 142 | 5/1991 |
| EP | 0 763 781 | 3/1997 |
| EP | 0 813 114 | 12/1997 |
| EP | 1 035 442 | 9/2000 |
| EP | 1 061 560 | 12/2000 |
| EP | 1 172 695 | 1/2002 |

OTHER PUBLICATIONS

European Search Report of corresponding European Application Ser. No. 02253293.1–1242.

* cited by examiner

*Primary Examiner*—Rosemary Ashton
(74) *Attorney, Agent, or Firm*—Peter F. Corless; Darryl P. Frickey; Edwards & Angell, LLP

(57) ABSTRACT

Antireflective compositions are provided that contain an ionic thermal acid generator material. Use of such a thermal acid generator material can significantly increase the shelf life of solutions of antireflective compositions in protic media. Antireflective compositions of the invention can be effectively used at a variety of wavelengths used to expose an overcoated photoresist layer, including 248 nm and 193 nm.

38 Claims, No Drawings

ANTIREFLECTIVE COATING COMPOSITIONS

This application claims the benefit of U.S. Provisional Application No. 60/290,446 filing date May 11, 2001.

BACKGROUND OF THE INVENTION

1. Field of the Invention

The present invention relates to compositions that reduce reflection of exposing radiation from a substrate back into an overcoated photoresist layer. More particularly, the invention relates to anti-reflective coating compositions that contains an ionic thermal acid generator compound. The compositions can exhibit, inter alia, enhanced storage stability.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced or chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less soluble in the developer solution. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See for example, PCT Application WO 90/03598, EPO Application No. 0 639 941 A1 and U.S. Pat. Nos. 4,910,122, 4370,405, 4,362,809, and 5,939,236. Such layers have also been referred to as antireflective layers or antireflective compositions. See also U.S. Pat. Nos. 5,939, 236; 5,886,102; 5,851,738; and 5,851,730, all assigned to the Shipley Company, which disclose highly usefull antireflective compositions.

SUMMARY OF THE INVENTION

We have now discovered new antireflective compositions for use with an overcoated photoresist layer that can exhibit enhanced properties, including enhanced storage stability (i.e. shelf life stability).

We have found that certain antireflective compositions can exhibit limited shelf life, e.g. produce particles or become turbid during storage and prior to use. More particularly, certain anti-reflective coating compositions include a thermal acid generator or an acid that limit the shelf life of the composition. Without being bound by theory, it is believed that interaction between antireflective composition components can result in less than desirable shelf life.

We have discovered that use of an ionic thermal acid generator compound can significantly enhance the storage stability of an organic solvent antireflective composition. Exemplary ionic thermal acid generators include e.g. sulfonate salts, preferably arylsulfonate salts such as toluenesulfonate acid amine salt.

Antireflective compositions of the invention suitably comprise a resin and a thermal acid generator (TAG). Preferred antireflective compositions of the invention contain a crosslinking component, and the antireflective composition is crosslinked prior to applying a photoresist composition layer over the antireflective composition layer. An antireflective composition may contain an oligiomeric or polymeric thermal acid generator as the sole resin component of an antireflective composition. It is generally preferred however that an antireflective composition contain at least one resin component in addition to any thermal acid generator component, e.g. to impart good film-forming properties to the antireflective composition.

Antireflective compositions of the invention also will contain a component that comprises chromophore groups that can absorb undesired radiation used to expose the overcoated resist layer from reflecting back into the resist layer. Generally preferred chromophores are aromatic groups, including both single ring and multiple ring aromatic groups such as optionally substituted phenyl, optionally substituted naphthyl, optionally substituted anthracenyl, optionally substituted phenanthracenyl, optionally substituted quinolinyl, and the like. Particularly preferred chromophores may vary with the radiation employed to expose an overcoated resist layer. More specifically, for exposure of an overcoated resist at 248 nm, optionally substituted anthracene is a particularly preferred chromophore of the antireflective composition. For exposure of an overcoated resist at 193 nm, optionally substituted phenyl is a particularly preferred chromophore of the antireflective composition. Preferably, such chromophore groups are linked (e.g. pendant groups) to a resin component of the antireflective composition, either a polymeric thermal acid generator component or an additional resin component distinct from the polymeric base additive.

As mentioned, preferred antireflective coating compositions of the invention can be crosslinked, e.g. by thermal and/or radiation treatment. For example, preferred antireflective coating compositions of the invention may contain a separate crosslinker component that can crosslink with one ore more other components of the antireflective composition. Generally preferred crosslinking antireflective compositions comprise a separate crosslinker component. Particularly preferred antireflective compositions of the invention contain as separate components: a resin, a crosslinker, and a thermal acid generator additive. Additionally, crosslinking antireflective compositions of the invention preferably can also contain an amine basic additive to promote elimination of footing or notching of the overcoated photoresist layer. Crosslinking antireflective compositions are preferably crosslinked prior to application of a photoresist layer over the antireflective coating layer. Thermal-induced crosslinking of the antireflective composition by activation of the thermal acid generator is generally preferred.

Antireflective compositions of the invention are typically formulated and applied to a substrate as an organic solvent solution. A variety of solvents, including protic solvents such as ethyl lactate can be utilized to formulate an antireflective composition of the invention.

Antireflective compositions of the invention may be used with a variety of overcoated photoresists. Preferred photoresists for use with antireflective compositions of the invention include chemically-amplified positive-acting photoresists, including photoresists that contain a component (typically a resin) that contains acetal or ketal groups (together referred to as acetal groups herein); ester groups such as t-butyl ester groups such as may be provided by polymerization of t-butylacrylate, t-butyl methacrylate, methyladamantyl acrylate, methyladamantyl methacrylate; and the like. Such resist resins also may contain other groups such as phenolic units which are preferred for imaging at deep UV wavelengths (248 nm); or non-aromatic groups such as polymerized optionally substituted norbornene, particularly for resists imaged with sub-200 nm radiation (e.g. 193 nm).

The invention further provides methods for forming a photoresist relief image and novel articles of manufacture comprising substrates (such as a microelectronic wafer substrate) coated with an antireflective composition of the invention alone or in combination with a photoresist composition. Additionally, the invention further provides stable substantially neutral solutions of antireflective compositions in protic media e.g. alcohols such as ethyl lactate for extended shelf life prior to use of the antireflective composition in forming an antireflective coating on a substrate. Other aspects of the invention are disclosed infra.

DETAILED DESCRIPTION OF THE INVENTION

As discussed above, a substantially neutral or ionic thermal acid generator additive is stable for extended time periods in protic media. Preferably the substantially neutral thermal acid generator composition is stable in protic media such as alcohols or water without generating an acidic solution for 1 or 2 months or greater, more typically about 3, 4, 5, 6, 7, 8 or 9 months or greater.

Without being bound by any theory, it is believed the use of an ionic thermal acid generator in an antireflective composition of the invention can inhibit undesired bleaching of the radiation-absorbing chromophore employed in the antireflective composition (e.g. anthracene for an antireflective composition imaged at 248 nm, phenyl for an antireflective composition imaged at 193 nm, and the like).

It is also believed that the cation component of the ionic thermal acid generator, particularly an amine-based anion, can provide beneficial effects. More particularly, for a so-called low-temperature photoresist that has an acetal resin, the thermally decomposed ionic thermal acid generator can help immobilize the thermally-generated acid in the antireflective composition coating layer. Such immobilization of the thermally-generated acid in the antireflective composition coating layer avoids migration of the acid into the overcoated photoresist layer. Such undesired migration of the thermally-generated acid into the resist layer can significantly compromise resolution of an image patterned in the resist layer, e.g. the developed resist relief image can have a negative slope profile (undercutting), where the migrated thermally-acid resulted in undesired removal of non-exposed lower regions of the resist layer.

In the case of so-called high temperature photoresists, e.g. resists that contain ester photoacid-labile groups such as polymerized t-butylacrylate or t-butylmethacrylate units, use of a volatile amine as the cation component for the thermal acid generator can provide significant benefits. In such systems, the amine can be removed (volatized) from the antireflective composition coating layer during thermal curing of that layer.

Preferred substantially neutral thermal acid generator additives contain sulfonate salts, such as carbocyclic aryl (e.g. phenyl, napthyl, anthracenyl, etc.), heteroaryI (e.g. thienyl) or aliphatic sulfonate salts, preferably carbocyclic aryl sulfonate salts. A thermal acid generator additive can be aromatic or non-aromatic. Preferred thermal acid generator additives contain optionally substituted benzenesulfonate salts, preferably para-alkylbenzenesulfonate salts.

As indicated above, preferred thermal acid generator cations contain at least one nitrogen. Preferred cations contain one or more optionally substituted amine groups. An amine-containing cation may contain one or more primary, secondary, tertiary and/or quaternary ammonium groups. Preferred amine-containing cations have one or more amine groups with an active proton, e.g. a primary, secondary and/or tertiary ammonium group. Substituents of an amine-containing cation of a thermal acid generator suitably may be e.g. optionally substituted alkyl such as optionally substituted $C_{1-12}$alkyl, optionally substituted aryl such as optionally substituted phenyl, naphthyl, anthracenyl, and the like; optionally substituted heteroalkyl such as optionally substituted $C_{1-12}$heteroalykl, particularly $C_{1-12}$alkoxy; etc.

Primary, secondary or tertiary aliphatic amines are particularly preferred cation components of thermal acid generators used in ARCs of the invention. For example, cationic counter ions of substantially neutral thermal acid generator compounds of the invention include those of the formula $[(R_1)(R_2)(R_3)NH]^+$, where $R_1$, $R_2$, and $R_3$ are independently hydrogen or an optionally substituted alkyl group such as optionally substituted $C_1$–$C_{16}$ alkyl, with at least one of $R_1$, $R_2$, and $R_3$ being other than hydrogen.

Substituents of substituted carbocyclic aryl groups of ionic carbocyclic aryl sulfonate salts of the invention include e.g. hydroxy; optionally substituted alkyl e.g. alkyl having from 1 to about 16 carbon atoms, more typically alkyl having from 1 to about 8 carbon atoms; optionally substituted alkenyl e.g. alkenyl having from 2 to about 16 atoms, more typically alkenyl having from 2 to about 8 atoms; optionally substituted alknyl e.g. alkynyl having from 2 to about 16 atoms, more typically alkynyl having from 2 to about 8 carbon atoms; optionally substituted alkoxy e.g. alkoxy having from 1 to about 16 atoms, more typically alkoxy having from 1 to about 8 atoms; optionally substituted carbocyclic aryl e.g. optionally substituted phenyl, optionally substituted naphthyl, optionally substituted anthracene and the like; optionally substituted aralkyl such as aralkyl having from 7 to about 20 carbon atoms e.g. optionally substituted benzyl and the like; and optionally substituted heteroaromatic or heteroalicyclic groups preferably having 1 to 3 rings, 3 to 8 ring members in each ring and form 1 to 3 heteroatoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperdinyl, morpholino, and pyrrolindinyl; etc. Further there can be 1, 2, 3, 4 or 5 independently chosen substituents on the arene ring or more specifically, at each occurrence of an arene hydrogen substituent can be optionally replaced with an abovelisted substituent. Preferred arene groups have 0, 1 or 2 independently chosen non-hydrogen substituents.

As discussed above, lower molecular weight substantially neutral thermal acid generator additives can also be suitably employed in antireflective compositions of the invention, including non-polymeric substantially neutral thermal acid generator additives. For example, suitable substantially neutral thermal acid generator additives include those having a molecular weight of less than about 600 daltons, more typically less than about 500, 400, 300, 200, or 150 daltons. A TAG additive typically will have a molecular weight of at least 100, 125, 150 or 200 daltons.

Preferred lower molecular weight ionic thermal acid generator additives, which may be non-polymeric, include substituted sulfonate ammonium salts, including ammonium or primary, secondary, and tertiary ammonium salts that may be substituted with e.g. groups specified above, i.e. hydroxy; optionally substituted alkyl; optionally substituted alkenyl; optionally substituted alkynyl; optionally substituted alkoxy; optionally substituted carbocyclic aryl; optionally substituted aralkyl; and optionally substituted heteroaromatic or heteroalicyclic groups; etc.

Ionic thermal acid generator compounds of the invention suitably may have a relatively high molecular weight. Such higher molecular weight materials will be less prone to volatilization during any thermal curing of an antireflective coating layer that contains the substantially neutral thermal acid generator compound. Preferred higher molecular weight substantially neutral thermal acid generator compounds have a molecular weight of at least about 100, 150, 200, 250, 300, 400, 500, 600, 700, 800, 900, 1000 daltons. Even higher molecular weight additives also will be preferred such as substantially neutral thermal acid generator additives having a molecular weight of at least about 1200, 1400, 1600, 1800, 2000, 2200, 2400, 2600, 2800, 3000, 3500, 4000, 4500, 5000, 6000, 7000, 8000, 9000, 10000, 15000, 20000, 30000 daltons. For polymeric materials, molecular weight references herein are to Mw.

Oligiomeric and polymeric ionic thermal acid generator additives having arylsulfonic acid salt substitutions either integral to the polymer backbone or as pendant moieties. Suitable oligiomeric or polymeric sulfonate salts of the antireflective compositions of the invention can be formed by polymerization of two or more distinct monomers. Such monomers may be characterized as a sulfonated monomer if the monomer contributes to the neutral thermal acid generator nature of the polymer, or as a non-sulfonated monomer if the monomer does not contribute to the neutral thermal acid generator nature of the polymer. Based on that nomenclature, preferred copolymer substantially neutral thermal acid generator additives comprise from about 1 to about 50 mole percent sulfonated monomers, more preferably from about 2 to about 20 mole percent sulfonated monomers, still more preferably from about 5 to about 10 mole percent sulfonated monomers.

Alternatively, appropriate oligiomeric or polymeric sulfonate salts of the antireflective compositions of the invention may be prepared by a post-polymerization process that introduces sulfonic acid or sulfonate salt groups into the polymer. Sulfonation reactions are well known in the art and any suitable reaction that will introduce a sulfonate or sulfonic acid residue in the polymer is acceptable. Nonlimiting examples include sulfonation by treatment of a polymer or oligiomer with sulfuric acid, sulfur trioxide, and like sulfonation reagents. Based on the above nomenclature, preferred post-polymerization sulfonated substantially neutral thermal acid generator additives comprise from about 1 to about 50 mole percent sulfonated monomers, more preferably from about 2 to about 20 mole percent sulfonated monomers, still more preferably from about 5 to about 10 mole percent sulfonated monomers.

Crosslinking antireflective compositions of the invention preferably comprise a substantially neutral thermal acid generator, e.g. an ammonium arenesulfonate salt, for catalyzing or promoting crosslinking during curing of an antireflective composition coating layer. Typically a non-polymeric or non-oligiomeric ionic thermal acid generator is present in an antireflective composition in a concentration from about 0.1 to 10 percent by weight of the total of the dry components of the composition, more preferably about 2 percent by weight of the total dry components. Polymeric or oligiomeric substantially neutral thermal acid generators are present in the antireflective composition in a concentration of from about 0.2 to about 20 percent by weight of the total of the dry components of the composition, more preferably from about 1 to about 5 percent by weight of the total dry components. The concentration of the polymeric or oligiomeric substantially neutral thermal acid generator is dependent upon the mole percent of sulfonated monomers in the polymeric additive e.g. for highly sulfonated polymer additives, a lower by weight concentration of substantially neutral thermal acid generator is suitable.

As discussed above, antireflective compositions may suitablely contain a resin component in addition to the base additive material. Suitable resin components may contain chromophore units for absorbing radiation used to image an overcoated resist layer before undesired reflections can occur.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophore, e.g. groups having from two to three to four fused or separate rings with 3 to 8 members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4–5 of European Published Application 813114A2 of the Shipley Company.

For imaging at 193 nm, the antireflective composition preferably may contain a resin that has phenyl chromophore units. For instance, one suitable antireflective resin for use with photoresists imaged at 193 nm is a terpolymer consisting of polymerized units of styrene, 2-hydroxyethylmethacrylate and methyhlethacrylate (30:38:32 mole ratio). Such phenyl group containing resins and use of same in antireflective compositions have been disclosed in U.S. application Ser. No. 09/153,575, file 1998 and corresponding European Published Application EP87600A1, assigned to the Shipley Company.

Preferably resins of antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

While antireflective composition resin binders having such absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the antireflective compositions of the invention may vary within relatively broad ranges, and in general the resin binder is employed in a concentration of from about 50 to 95 weight percent of the total of the dry components of the antireflective composition, more typically from about 60 to 90 weight percent of the total dry components (all components except solvent carrier).

Crosslinking-type antireflective compositions of the invention also contain a crosslinker component. A variety of crosslinkers may be employed, including those antireflective composition crosslinkers disclosed in Shipley European Application 542008 incorporated herein by reference. For example, suitable antireflective composition crosslinkers include amine-based crosslinkers such as melamine materials, including melamine resins such as manufactured by American Cyanamid and sold under the tradename of Cymel 300, 301, 303, 350, 370, 380, 1116 and 1130. Glycolurils are particularly preferred including glycolurils available from American Cyanamid. Benzoquanamines and urea-based materials also will be suitable including resins such as the benzoquanamine resins available from American Cyanamid under the name Cymel 1123 and 1125, and urea resins available from American Cyanamid under the names of Beetle 60, 65, and 80. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Suitable substantially neutral crosslinkers include hydroxy compounds, particularly polyfunctional compounds such as phenyl or other aromatics having one or more hydroxy or hydroxy alkyl substitutents such as a $C_{1-8}$hydroxyalkyl substitutents. Phenol compounds are generally preferred such as di-methanolphenol ($C_6H_3(CH_2OH)_2)H$) and other compounds having adjacent (within 1–2 ring atoms) hydroxy and hydroxyalkyl substitution, particularly phenyl or other aromatic compounds having one or more methanol or other hydroxylalkyl ring substitutent and at least one hydroxy adjacent such hydroxyalkyl substituent.

It has been found that a substantially neutral crosslinker such as a methoxy methylated glycoluril used in antireflective compositions of the invention can provide excellent lithographic performance properties, including significant reduction (SEM examination) of undercutting or footing of an overcoated photoresist relief image.

A crosslinker component of antireflective compositions of the invention in general is present in an amount of between about 5 and 50 weight percent of total solids (all components except solvent carrier) of the antireflective composition, more typically in an amount of about 7 to 25 weight percent total solids.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight of the antireflective composition.

A variety of photoresist compositions can be employed with the antireflective compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with antireflective compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, al of which are incorporated herein by reference for their teaching of making and using chemically amplified positive-acting resists.

As discussed above, antireflective compositions also are suitably used with positive chemically-amplified photoresists that have acetal groups that undergo deblocking in the presence of a photoacid. Such acetal-based resists have been described in e.g. U.S. Pat. Nos. 5,929,176 and 6,090,526.

The antireflective compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Copolymers containing phenol and nonaromatic cyclic alcohol units are also preferred resin binders for resists of the invention and may be suitably prepared by partial hydrogenation of a novolak or poly(vinylphenol) resin. Such copolymers and the used thereof in photoresist compositions are disclosed in U.S. Pat. No. 5,128,232 to Thackeray et al.

Preferred negative-acting resist compositions for use with an antireflective composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, Powderlink 1174, urea-based resins are sold under the tradenames of Beetle 60, 65 and 80, and benzoguanamine resins are sold under the trade names of Cymel 1123 and 1125.

Suitable photoacid generator compounds of resists used with antireflective compositions of the invention include the onium salts, such as those disclosed in U.S. Pat. Nos. 4,442,197, 4,603,10, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonlyoxy ketones. See J. of Photopolymer Science and Technology, 4(3):337–340 (1991), for disclosure of suitable sulfonate PAGS, including benzoin tosylate, t-butylphenyl alpha-(p-toluenesulfonyloxy)-acetate and t-butyl alpha(p-toluenesulfonyloxy)-acetate. Preferred sulfonate PAGs are also disclosed in U.S. Pat. No. 5,344,742 to Sinta et al. The above camphorsulfoanate PAGs 1 and 2 are also preferred photoacid generators for resist compositions used with the antireflective compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Antireflective compositions of the invention that include a low basicity crosslinker such as a suitable glycoluril are particularly useful with photoresists that generate a strong acid photoproduct upon exposure such as triflic acid, camphor sulfonic acid, or other sulfonic acid, or other acid having a pKa (25° C.) of about 2 or less. Without wishing to be bound by theory, it is believed that antireflective compositions of the invention are particularly effective with such strong acid resists because the strong photogenerated acid will migrate from the resist and remain in the antireflective composition layer to a lesser extent relative to a comparable antireflective composition that contains a more basic crosslinker. That is, the low basicity crosslinkers will tie up strong photogenerated acids of an overcoated resist layer to a lesser extent than a more basic antireflective composition crosslinker. As a result, less acid loss from the resist layer will occur and resolution problems such as footing will be even further reduced.

Various substituents and materials (including substantially neutral thermal acid generators, resins, etc.) as being "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

In use, an antireflective composition of the invention is applied as a coating layer to a substrate by any of a variety of methods such as spin coating. The antireflective composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the antireflective coating layer is cured before a photoresist composition is applied over the antireflective composition. Cure conditions will vary with the components of the antireflective composition. Particularly the cure temperature will depend on the specific substantially neutral thermal acid generator. Typical cure conditions are from about 80° C. to 225° C. for about 0.5 to 40 minutes. Cure conditions preferably render the antireflective composition coating layer substantially insoluble to the photoresist solvent as well as an alkaline aqueous developer solution.

After such curing, a photoresist is applied over the surface of the antireflective composition. As with application of the antireflective composition, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the antireflective composition layer and photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the crosslinked antireflective coating layer.

All documents mentioned herein are incorporated herein by reference. The following non-limiting examples are illustrative of the invention.

EXAMPLE 1

Synthesis of ARC Polymer

An initial amount of 249 kg THF is charged to the 100 gallon reactor using residual vacuum. 21.05 kg of 9 Anthracene Methyl Methacrylate (Antma) is added to reactor and mixed with THF until dissolved. The pre-weighed quantities of 16.00 kg Methyl Methacrylate (MMA), 12.5 kg 2-Hydroxyethyl Methacrylate (HEMA), and Vazo 65 free radical initiator solutions are added to the reactor. The reaction mixture is agitated under vacuum and purged with nitrogen three times to remove dissolved oxygen. After the final nitrogen purging, the vessel is heated to a reaction temperature of 66C and run at reflux temperature and atmospheric pressure for 30 hrs.

MTBE is used as the precipitation solvent and is charged via vacuum to the precipitation vessel. When the reaction is complete and the batch is cooled down, it is transferred to the precipitation vessel in several increments for precipitation through a spray nozzle to form a slurry. The product is filtered out using a 48" Hastelloy buchner funnel fitted with a 10 μm polypro filter bag. The cake is washed with additional MTBE. A dam is put on the filter cake on the Buchner Funnel and air is passed over the filter cake to remove MTBE and dry the cake. PGME is charged to a process vessel, and then the filter cake is charge to the process vessel for vacuum stripping of MTBE.

The finished product is drummed off as a 14–16% polymer solution in PGME.

All process equipment is washed with propylene glycol methyl ether (PGME), followed by Acetone. Plastic containers can be cleaned with THF after use. About 200 gms of Phenothiazine inhibitor is added to the process filtrate of THF and MTBE to inhibit peroxide formation.

EXAMPLE 2

Reference ARC with Non-ionic TAG (Comparative)

An antireflective composition was prepared by dissolving together 0.7845 g of the polymer of Example 1, 0.0990 g of Powderlink 1174 crosslinker (from Cytec Industries), 0.009 g of p-nitrobenzyltosylate thermal acid generator, 0.0072 g of FC 430 surfactant (3M Corp.) and 30.96 g of proylene glycol methyl ether alcohol solvent. After dissolution, the solution was filtered through a polyproylene filter with a 0.2 um pore size.

The filtered solution was then spin-cast on a 100 mm silicon wafer and then baked at 175° C., to give a film thickness of about 600 angstroms. A popular commercially available "hybrid-acetal resist", SE430 (Shin Etsu Corp.) was then spin coated on top of the antireflective film, and baked at 90 C for 60 seconds to give a film thickness of 6000 angstroms. The resist was then exposed on a GCA 0.55 NA stepper using 248 nm light through a mask to form a equal lines/spaces patterns of various resolutions in the film. The resist film was then post-exposure baked at 110 C/60 sec, and developed with 2.38% tetramethyl ammonium hydroxide developer using a standard wafer-track single-puddle process.

The developed wafers were then inspected using a scanning electron microscope to determine the patterned fidelity. An exposure dose was chosen which gave a line/space pattern of equal size.

SE430 resist on the antireflective film of this composition gave poor pattern fidelity. The resist sidewalls were significantly undercut at the resist/antiflective interface. At resolutions less than or equal too 240 nm, the resist undercut was bad enough to cause complete pattern collapse.

This example illustrates the problems experienced with antireflective compositions containing non-ionic thermal acid generators.

EXAMPLE 3

Reference ARC Containing an Acidic Crosslinking Catalyst

An antireflective composition was prepared by dissolving together 0.7845 g of the polymer of Example 1, 0.0990 g of Powderlink 1174 crosslinker (from Cytec Industries), an acid crosslinking catalyst consisting of 0.009 g of p-toluene sulphonic acid monohydrate (Aldrich Corp.), 0.0072 g of FC 430 surfactant (3M Corp.) and 30.96 g of proylene glycol methyl ether alcohol solvent. After dissolution, the solution was filtered through a polyproylene filter with a 0.2 um pore size.

The filtered solution was then spin-cast on a 100 mm silicon wafer and then baked at 175° C., to give a film thickness of about 600 angstroms. A popular commercially available "hybrid-acetal resist", SE430 (Shin Etsu Corp.) was then spin coated on top of the antireflective film, and baked at 90 C for 60 seconds to give a film thickness of 6000 angstroms. The resist was then exposed on a GCA 0.55 NA stepper using 248 nm light through a mask to form a equal lines/spaces patterns of various resolutions in the film. The resist film was then post-exposure baked at 110° C./60 sec, and developed with 2.38% tetramethyl ammonium hydroxide developer using a standard wafer-track single-puddle process.

The developed wafers were then inspected using a scanning electron microscope to determine the patterned fidelity. An exposure dose was chosen which gave a line/space pattern of equal size.

The SE430 resist displayed a "bowed" resist sidewall appearance, with an undercut at the resist/antireflectant interface. The undercut was less than observed in Example 2.

EXAMPLE 4

ARC Using an Ionic Thermal Acid Generator

The thermal acid generator (TAG) evaluated in this example was Nacure 5225, an amine salt of dodecylbenzene sulphonic acid.

An antireflective composition was prepared by dissolving together 0.7845 g of the polymer of Example 1, 0.0990 g of Powderlink 1174 crosslinker (from Cytec Industries), an acid crosslinking catalyst consisting of 0.009 g of Nacure 5225 (King Industries), 0.0072 g of FC 430 surfactant (3M Corp.) and 30.96 g of proylene glycol methyl ether alcohol solvent. After dissolution, the solution was filtered through a polyproylene filter with a 0.2 um pore size.

The filtered solution was then spin-cast on a 100 mm silicon wafer and then baked at 175° C., to give a film thickness of about 600 angstroms. A popular commercially available "hybrid-acetal resist", SE430 (Shin Etsu Corp.) was then spin coated on top of the antireflective film, and baked at 90° C. for 60 seconds to give a film thickness of 6000 angstroms. The resist was then exposed on a GCA 0.55 NA stepper using 248 nm light through a mask to form a equal lines/spaces patterns of various resolutions in the film. The resist film was then post-exposure baked at 110° C./60 seconds, and developed with 2.38% tetramethyl ammonium hydroxide developer using a standard wafer-track single-puddle process.

The developed wafers were then inspected using a scanning electron microscope to determine the patterned fidelity. An exposure dose was chosen which gave a line/space pattern of equal size.

The SE430 resist displayed a straight resist sidewall appearance, with no undercut or footing at the resist/antireflectant interface. Resist adhesion was excellent, with features of 200 nm resolution showing no tendency to tip over.

EXAMPLE 5

ARC Using an Ionic Thermal Acid Generator

The thermal acid generator evaluated in this example was Nacure XC 9225, an amine salt of dinonylnaphthalene sulphonic acid sulphonic acid.

An antireflective composition was prepared by dissolving together 0.7845 g of the polymer of Example 1, 0.0990 g of Powderlink 1174 crosslinker (from Cytec Industries), an acid crosslinking catalyst consisting of 0.009 g of Nacure 5225 (King Industries), 0.0072 g of FC 430 surfactant (3M Corp.) and 30.96 g of proylene glycol methyl ether alcohol solvent. After dissolution, the solution was filtered through a polyproylene filter with a 0.2 um pore size.

The filtered solution was then spin-cast on a 100 mm silicon wafer and then baked at 175° C., to give a film thickness of about 600 angstroms. A popular commercially available "hybrid-acetal resist", SE430 (Shin Etsu Corp.) was then spin coated on top of the antireflective film, and baked at 90 C for 60 seconds to give a film thickness of 6000 angstroms. The resist was then exposed on a GCA 0.55 NA stepper using 248 nm light through a mask to form a equal lines/spaces patterns of various resolutions in the film. The resist film was then post-exposure baked at 110 C/60 sec, and developed with 2.38% tetramethyl ammonium hydroxide developer using a standard wafer-track single-puddle process.

The developed wafers were then inspected using a scanning electron microscope to determine the patterned fidelity. An exposure dose was chosen which gave a line/space pattern of equal size.

The SE430 resist displayed a straight resist sidewall appearance, with no undercut or footing at the resist/antireflectant interface. Resist adhesion was excellent, with features of 200 nm resolution showing no tendency to tip over.

EXAMPLE 6

Improvement of Antireflectant Shelf Life Using Ionic Thermal Acid Generator

It has been found that organic antireflectant composition undergo chemical changes as they age, and that this rate of change increases at higher storage temperatures. It is desirable that the chemical properties of the antireflectant film do not change, as changes in film absorbance, refractive indices or density of crosslinking can have a negative impact on lithographic performance. One of the aging changes that has been observed in prior antireflectants is a change in the absorbance spectrum with storage time. While not wanting to be bound by theory, we believe the changes to be caused by oxidation of chromophore groups by acidic species in the antireflectant solution.

Aging phenomena was studied by storing antireflectant solutions at 40° C. to accelerate aging processes. A prior antireflectant composition containing p-toluene sulphonic acid as the crosslinking catalyst was compared to an antireflectant composition containing Nacure 5225 as the crosslinking catalyst. Absorbance was measured at 220 nm, a peak which we found to correlate with absorbance changes also observed at 250 nm and even 300–400 nm. Samples of the antireflectant were removed and diluted with THF to the same fixed concentration, prior to measurement of absorbance in a quartz cell.

Reflectant with Nacure 5225 Ionic TAG

An antireflective composition was prepared by dissolving together 0.6682 g of the polymer of Example 1, 0.1177 g of the trimeric condensate of resorcinol and diethylol-p-cresol (plasticizer), 0.0990 g of Powderlink 1174 crosslinker (from Cytec Industries), an acid crosslinking catalyst consisting of 0.009 g of Nacure 5225 (King Industries), 0.0072 g of FC 430 surfactant (3M Corp.) and 30.96 g of proylene glycol methyl ether alcohol solvent. After dissolution, the solution was filtered through a polyproylene filter with a 0.2 um pore size.

Reflectant with p-toluenesulphonic Acid Catalyst

An antireflective composition was prepared by dissolving together 0.6682 g of the polymer of Example 1, 0.1177 g of the trimeric condensate of resorcinol and diethylol-p-cresol (plasticizer), 0.0990 g of Powderlink 1174 crosslinker (from Cytec Industries), an acid crosslinking catalyst consisting of 0.009 g of p-toluenesulphonic acid monohydrate (Aldrich), 0.0072 g of FC 430 surfactant (3M Corp.) and 30.96 g of proylene glycol methyl ether alcohol solvent. After dissolution, the solution was filtered through a polypropylene filter with a 0.2 um pore size.

Initial absorbance at 220 nm, time zero, after dilution into THF:

Reflectant with Nacure 5225 ionic TAG: 0.0718 absorbance units

Reflectant with p-toluenesulphonic acid catalyst: 0.0254 absorbance units

Absorbance at 220 nm, after 2 days aging of the reflectant at 40 C.:

Reflectant with Nacure 5225 ionic TAG: 0.0722 absorbance units

Reflectant with p-toluenesulphonic acid catalyst: 0.1655 absorbance units

Those results illustrates that the antireflectant compositions of this invention show aging related changes in the absorbance spectrum at only 3% of the rate of prior antireflectants that contain an acidic catalyst.

The foregoing description of the invention is merely illustrative thereof, and it is understood that variations and modifications can be effected without departing from the scope or spirit of the invention as set forth in the following claims.

What is claimed is:

1. A coated substrate comprising:

an antireflective composition layer comprising a resin and an ionic thermal acid generator that comprises 1) a sulfonate having an optionally substituted phenyl substituent or 2) a sulfonate having an optionally substituted anthracene substituent; and a photoresist layer over the antireflective composition layer.

2. The substrate of claim 1 wherein the thermal acid generator comprises a sulfonate having an optionally substituted phenyl substituent.

3. The substrate of claim 1 wherein the thermal acid generator is an optionally substituted benzenesulfonate salt.

4. The substrate of claim 1 wherein the thermal acid generator comprises a para-alkylbenzenesulfonate salt.

5. The substrate of claim 1 wherein the thermal acid generator comprises a toluenesulfonate acid amine salt.

6. The substrate of claim 1 wherein the thermal acid generator comprises a sulfonate having an optionally substituted anthracene substituent.

7. The substrate of claim 1 wherein the thermal acid generator comprises a nitrogen-containing cation component.

8. The substrate of claim 1 wherein the thermal acid generator comprises a counter ion that includes one or more amine groups.

9. The substrate of claim 1 wherein the thermal acid generator comprises a cation component that is a primary, secondary or tertiary aliphatic amine.

10. The substrate of claim 1 wherein the antireflective composition layer further comprises a crosslinker component.

11. The substrate of claim 1 wherein the antireflective composition is crosslinked.

12. The substrate of claim 1 wherein the antireflective composition layer comprises a resin having anthracene groups.

13. The substrate of claim 1 wherein the antireflective composition layer comprises a resin having phenyl groups.

14. The substrate of claim 1 wherein the antireflective composition layer comprises a resin having naphthyl groups.

15. The substrate of claim 1 wherein the photoresist composition is a chemically-amplified positive-acting photoresist composition.

16. The substrate of claim 1 wherein the photoresist composition is a negative-acting photoresist.

17. A coated substrate comprising:

an antireflective composition layer comprising a resin and a polymeric ionic thermal acid generator; and a photoresist layer over the antireflective composition layer.

18. The substrate of claim 17 wherein the thermal acid generator comprises a sulfonate salt.

19. The substrate of claim 17 wherein the thermal acid generator comprises a counter ion that includes one or more amine groups.

20. The substrate of claim 17 wherein the antireflective composition layer further comprises a crosslinker component.

21. The substrate of claim 17 wherein the antireflective composition is crosslinked.

22. The substrate of claim 17 wherein the antireflective composition layer comprises a resin having anthracene groups, phenyl groups, or naphthyl groups.

23. The substrate of claim 17 wherein the photoresist composition is a chemically-amplified positive-acting photoresist composition.

24. The substrate of claim 17 wherein the photoresist composition is a negative-acting photoresist.

25. A method of forming a photoresist relief image comprising:

applying over a substrate a layer of an antireflective composition comprising a resin and an ionic thermal acid generator that comprises 1) a sulfonate having an optionally substituted phenyl substituent or 2) a sulfonate having an optionally substituted anthracene substituent;

applying a photoresist layer over the antireflective composition layer; and exposing and developing the photoresist layer.

26. The method of claim 25 wherein the thermal acid generator comprises a sulfonate having an optionally substituted phenyl substituent.

27. The method of claim 25 wherein the thermal acid generator is an optionally substituted benzenesulfonate salt.

28. The method of claim 25 wherein the thermal acid generator comprises a para-alkylbenzenesulfonate salt.

29. The method of claim 25 wherein the thermal acid generator comprises a toluenesulfonate acid amine salt.

30. The method of claim 25 wherein the thermal acid generator comprises a sulfonate having an optionally substituted anthracene substituent.

31. The method of claim 25 wherein the thermal acid generator comprises a nitrogen-containing cation component.

32. The method of claim 25 wherein the antireflective composition is crosslinked prior to application of the photoresist layer.

33. The method of claim 25 wherein the photoresist layer is exposed with radiation having a wavelength of less than about 250.

34. A method of forming a photoresist relief image comprising:

applying over a substrate a layer of an antireflective composition an antireflective composition layer comprising a resin and a polymeric ionic thermal acid generator;

applying a photoresist layer over the antireflective composition layer; and exposing and developing the photoresist layer.

35. The substrate of claim 34 wherein the thermal acid generator comprises a sulfonate salt.

36. The method of claim 34 wherein the antireflective composition is crosslinked prior to application of the photoresist layer.

37. The method of claim 34 wherein the photoresist layer is exposed with radiation having a wavelength of less than about 250.

38. An antireflective composition for use with an overcoated photoresist composition, the antireflective composition comprising:

1) an aromatic resin;

2) a polymeric ionic thermal acid generator; and 3) a crosslinker.

* * * * *